United States Patent [19]
Asai et al.

[11] Patent Number: 5,844,263
[45] Date of Patent: Dec. 1, 1998

[54] SEMICONDUCTOR INTEGRATED DEVICE HAVING INDEPENDENT CIRCUIT BLOCKS AND A POWER BREAKING MEANS FOR SELECTIVELY SUPPLYING POWER TO THE CIRCUIT BLOCKS

[75] Inventors: Mikio Asai; Masahiko Hyozo; Ryoichi Takagi, all of Tokyo, Japan

[73] Assignee: Mitsubishi Denki Kabushiki Kaisha, Tokyo, Japan

[21] Appl. No.: 837,940

[22] Filed: Apr. 28, 1997

[30] Foreign Application Priority Data

Jan. 6, 1997 [JP] Japan ................................ 9-000321

[51] Int. Cl.⁶ .................................................. H01L 27/10
[52] U.S. Cl. ........................................ 257/208; 257/207
[58] Field of Search ..................................... 257/202–211

[56] References Cited

U.S. PATENT DOCUMENTS

| | | |
|---|---|---|
| 5,334,866 | 8/1994 | Kubo . |
| 5,371,390 | 12/1994 | Mohsen . |
| 5,404,035 | 4/1995 | Taniguchi et al. . |
| 5,537,328 | 7/1996 | Ito . |
| 5,648,661 | 7/1997 | Rostoker et al. ...................... 257/208 |

FOREIGN PATENT DOCUMENTS

| | | |
|---|---|---|
| 61-190958 | 8/1986 | Japan . |
| 4-162659 | 6/1992 | Japan . |
| 4-330716 | 11/1992 | Japan . |
| 5-183055 | 7/1993 | Japan . |
| 5-211236 | 8/1993 | Japan . |
| 5-343648 | 12/1993 | Japan . |
| 7-170038 | 7/1995 | Japan . |
| 8-125124 | 5/1996 | Japan . |

*Primary Examiner*—David B. Hardy
*Attorney, Agent, or Firm*—Burns, Doane, Swecker & Mathis, LLP

[57] ABSTRACT

A semiconductor integrated device including a first circuit block, a second circuit block, a first supply interconnection connected to the first circuit block to supply power thereto, a second supply interconnection connecting the first supply interconnection to the second circuit block, and a switch inserted across the first and second supply interconnections. The switch has a structure equivalent to a plurality of switching elements disposed in parallel on a substrate. The switch is opened by a break command output from the first circuit block so that the second supply interconnection is disconnected from the first supply interconnection, thereby preventing a standby current from flowing to the second circuit block when it is unused. This can solve a problem of a conventional semiconductor integrated device in that the standby current flowing to the second circuit block wastes power even if the second block is not used.

16 Claims, 7 Drawing Sheets

SEMICONDUCTOR INTEGRATED DEVICE HAVING INDEPENDENT CIRCUIT BLOCKS AND A POWER BREAKING MEANS FOR SELECTIVELY SUPPLYING POWER TO THE CIRCUIT BLOCKS

BACKGROUND OF THE INVENTION

1. Field of the Invention

The present invention relates to a semiconductor integrated device including a plurality of circuit blocks operating independently of each other.

2. Description of Related Art

Figure 11:
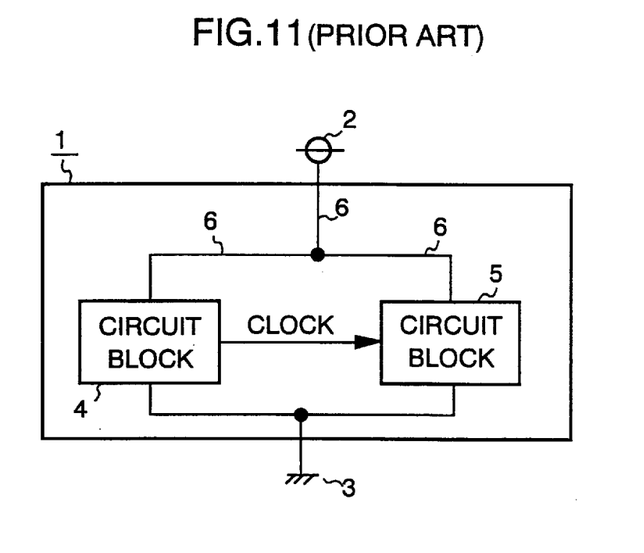
FIG. 11 is a circuit diagram showing a conventional semiconductor integrated device.

FIG. 11 is a circuit diagram shown a conventional semiconductor integrated device, in which the reference numeral 1 designates a semiconductor integrated device, 2 designates a device power supply, 3 designates ground, 4 and 5 each designate a circuit block operating independently of each other, 6 designates a supply interconnection for supplying power to the circuit blocks 4 and 5.

Next, the operation will be described.

First, the supply interconnection 6 is usually shared by the circuit blocks 4 and 5 in the semiconductor integrated device with the single device power supply 2 interconnected as shown in FIG. 11. Accordingly, even if one of the circuit blocks 4 and 5 is not used depending on a utilizing mode of the semiconductor integrated device 1, the power is always supplied to the unused circuit, thereby causing a problem of increasing the consumed power.

In view of this, the conventional semiconductor integrated device 1 reduces the consumed power of the circuit block 5 by interrupting the supply of a clock signal or reducing the frequency of the clock signal fed from the circuit block 4 to the circuit block 5 in the case where the circuit block 5 operates in response to the clock signal fed from the circuit block 4.

Although the conventional semiconductor integrated device with such an arrangement can reduce the consumed power of the unused circuit block 5, it still presents a problem in that the power is wasted because of the standby current flowing from the device power supply 2 to the circuit block 5.

SUMMARY OF THE INVENTION

The present invention is implemented to solve the foregoing problem. It is therefore an object of the present invention to provide a semiconductor integrated device capable of reducing the consumed power by breaking the standby current flowing to an unused circuit block.

According to a first aspect of the present invention, there is provided a semiconductor integrated device comprising: a first circuit block and a second circuit block operating independently of each other; a first supply interconnection connected to a device power supply for supplying power to the first circuit block; a second supply interconnection connected to the first supply interconnection for supplying power to the second circuit block; and power breaking means inserted in a connecting portion of the first supply interconnection to the second supply interconnection for breaking the connecting portion in response to a break command, wherein the power breaking means has a structure equivalent to a plurality of switching elements disposed in parallel.

Here, the power breaking means may be formed in a doped region in a substrate in which an end of the first supply interconnection and an end of the second supply interconnection are formed such that the two ends engage in comblike fashion with the two ends electrically isolated from each other, and the power breaking means may further comprise an electrode disposed over the two ends for receiving the break command.

The semiconductor integrated device may further comprise a resistor and a capacitor connected in parallel with the second circuit block.

The semiconductor integrated device may further comprise a pad connected to the second supply interconnection.

According to a second aspect of the present invention, there is provided a semiconductor integrated device comprising: a plurality of circuit blocks operating independently of each other; a plurality of supply interconnections, each of which is connected to a device power supply for supplying power to one of the plurality of circuit blocks; control means for outputting a break command; and a plurality of power breaking means for breaking the plurality of supply interconnections in response to the break command issued from the control means, each of the plurality of power breaking means being inserted in one of the plurality of supply interconnections to interrupt it, wherein each of the power breaking means has a structure equivalent to a plurality of switching elements disposed in parallel.

Here, the plurality of power breaking means may be formed in a doped region in a substrate in which an end of a primary side and an end of a secondary side of each of the plurality of supply interconnections are formed such that the two ends engage with each other in comblike fashion with the two ends electrically isolated from each other, and each of the plurality of power breaking means may further comprise an electrode disposed over the two ends for receiving the break command.

The semiconductor integrated device may further comprise a resistor and a capacitor connected in parallel with each of the circuit blocks.

The semiconductor integrated device may further comprise a pad connected to each one of the plurality of supply interconnections.

DETAILED DESCRIPTION OF THE PREFERRED EMBODIMENTS

The invention will now be described with reference to the accompanying drawings.

EMBODIMENT 1

Figure 1:
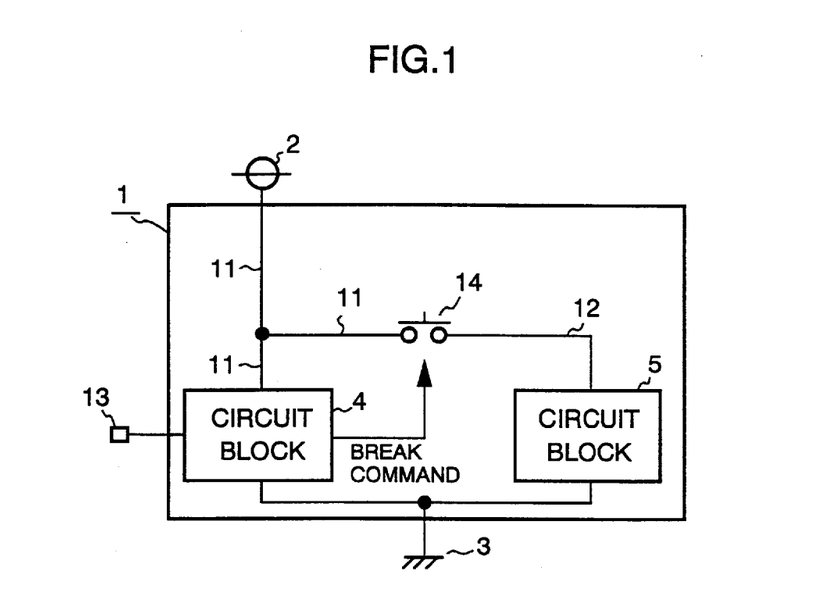
FIG. 1 is a circuit diagram showing an embodiment 1 of a semiconductor integrated device in accordance with the present invention.

FIG. 1 is a circuit diagram showing an embodiment 1 of a semiconductor integrated device in accordance with the present invention. In this figure, the reference numeral 1 designates a semiconductor integrated device, 2 designates a device power supply, 3 designates ground, 4 and 5 each designate a circuit block operating independently of each other, 11 designates a supply interconnection (first supply interconnection) connected to the device power supply 2 for supplying power to the circuit block 4, 12 designates a supply interconnection (second supply interconnection) connected to the first supply interconnection 11 for supplying power to the circuit block 5, 13 designates an external input port for inputting a break command, and 14 designates a switch (power supply breaking means) for breaking a connection between the first supply interconnection 11 and the second supply interconnection 12 when a break command is input to the external input port 13 so that the circuit block 4 outputs a break command in response thereto.

Next, the operation will be described.

First, when using both the circuit blocks 4 and 5, the switch 14 is closed so that the power is supplied to both the circuit blocks from the device power supply 2.

On the other hand, when the circuit block 5 is not used, the break command is input to the external input port 13 so that the circuit block 4 outputs the break command. The switch 14, receiving the break command from the circuit block 4, opens the connection between the first and second supply interconnections 11 and 12.

Thus, the power supply from the device power supply 2 to the circuit block 5 is interrupted, and the circuit block 5 ceases its operation. In addition, since the power supply is interrupted, no standby current flows to the circuit block 5.

Figure 2:
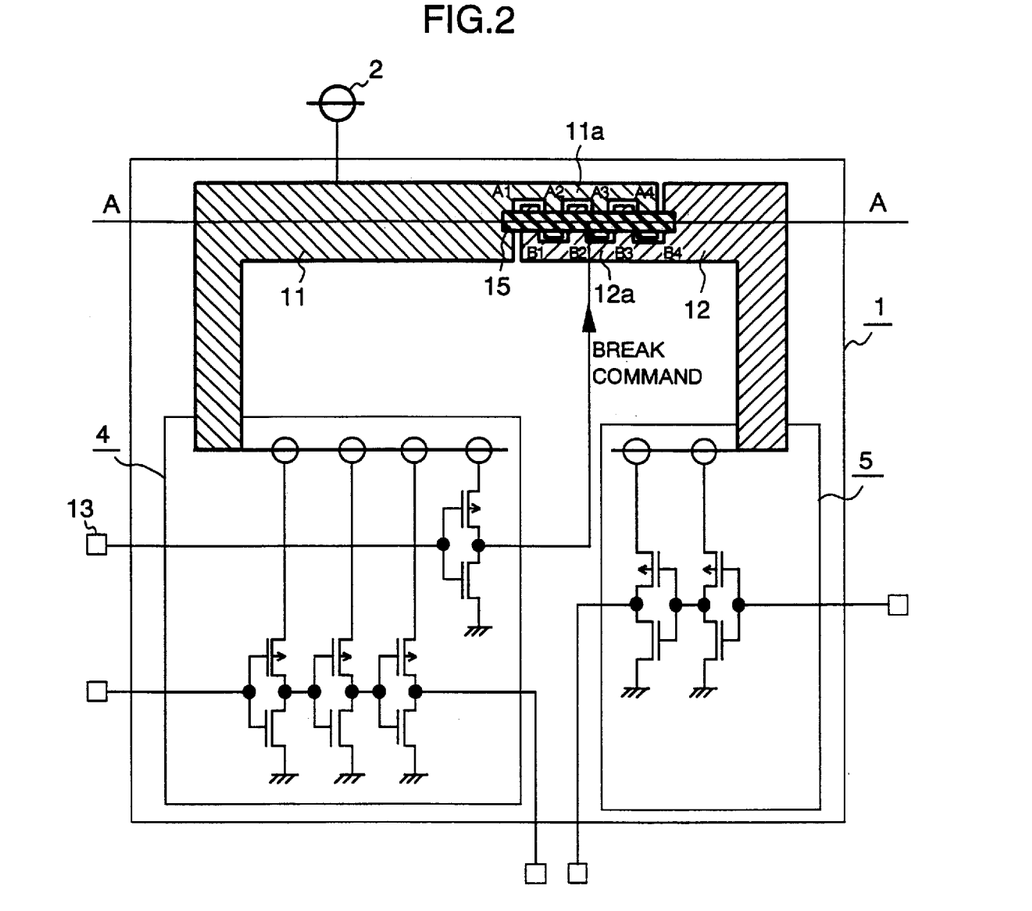
FIG. 2 is a plan view showing the structure of a switch 14.

FIG. 2 is a plan view illustrating the structure of the switch 14. In this figure, the reference numeral 11a designates an end of the first supply interconnection 11 which is a primary supply interconnection for the switch 14, 12a designates an end of the second supply interconnection 12 which is a secondary supply interconnection for the switch 14, A1–A4 designate a comblike engaging portion of the end 11a engaged with a comblike engaging portion B1–B4 of the end 12a in such a manner that they are electrically isolated from each other, and 15 designates an electrode disposed over the ends 11a and 12a.

Figure 3:
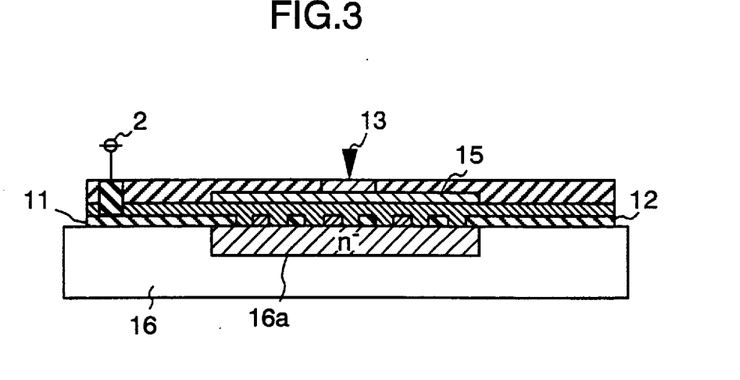
FIG. 3 is a cross-sectional view of the switch 14 taken along the A—A line in FIG. 2.

FIG. 3 is a cross-sectional view taken along the A—A line of FIG. 2, and illustrating the structure of the switch 14. In this figure, the reference numeral 16 designates a silicon substrate of the semiconductor integrated device, and 16a designates a doped region of the silicon substrate 16 to which ions or the like are implanted for doping.

Figure 4:
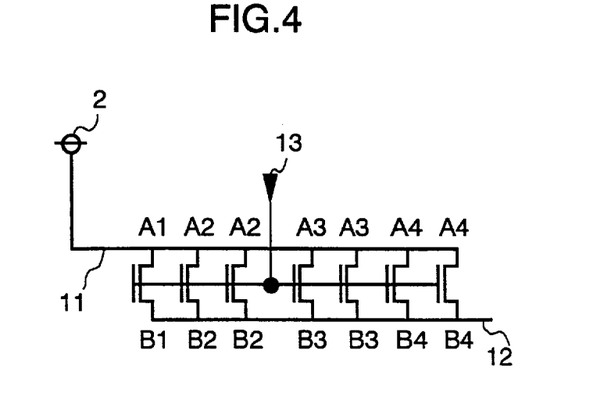
FIG. 4 is a circuit diagram showing the circuital structure of the switch 14.

The switch 14 with the structure as shown in FIGS. 2 and 3 is equivalent to a circuit as shown in FIG. 4, in which a plurality of gates (switching elements) are formed in parallel.

This can reduce the closed circuit resistance of the switch 14, which offers an advantage that the power wasted by the switch 14 can be reduced to a negligible degree when the circuit block 5 is powered through the switch 14 inserted between the first and second supply interconnections 11 and 12.

In contrast with this, when a common switching device such as a transistor is used as the switch 14, the power is wasted by the switch 14 owing to its large closed circuit resistance during the operation of the circuit block 5.

The switch 14 is closed by applying a positive potential (of 3–5 volts) to the electrode 15 without providing the external input port 13 with the break command. Thus, the power is supplied from the device power supply 2 to the second supply interconnection 12 through the first supply interconnection 11 and doped region 16a.

On the other hand, when the ground potential is applied to the electrode 15 by inputting the break command to the external input port 13, the switch 14 is opened so that the second supply interconnection 12 is disconnected from the first supply interconnection 11.

According to the present embodiment 1, since the switch 14 opens the connection between the first and second supply interconnections 11 and 12 when the break command is output from the circuit block 4, the power supplied from the device power supply 2 to the circuit block 5 is kept interrupted while the circuit block 5 is at rest. This makes it possible to prevent the standby current from flowing to the circuit block 5 while it is free from operation, offering an advantage of reducing the consumed power.

Although only one external input port 13 is provided in the embodiment 1, a plurality of external input ports 13 can be provided so that the circuit block 4 can issue the break command in accordance with a combination of the potentials applied to the external input ports 13.

EMBODIMENT 2

Figure 5:
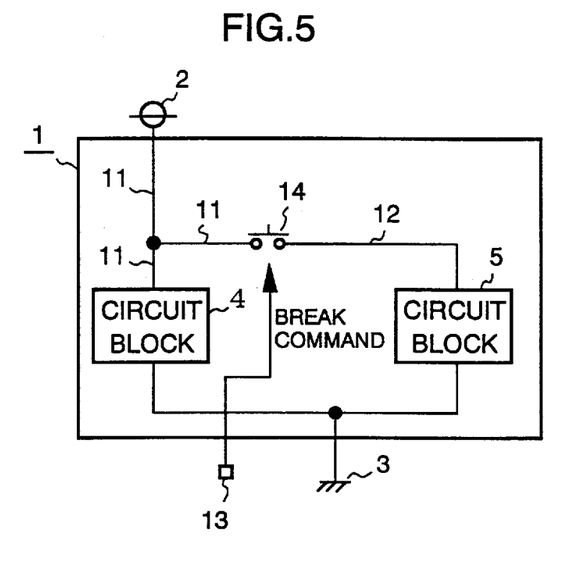
FIG. 5 is a circuit diagram showing an embodiment 2 of the semiconductor integrated device in accordance with the present invention.

Although the break command is output to the switch 14 via the circuit block 4 in the embodiment 1, it can be provided directly to the switch 14 without the intermediary of the circuit block 4 as shown in FIG. 5. In this case also, the same advantage can be gained as the embodiment 1.

EMBODIMENT 3

Figure 6:
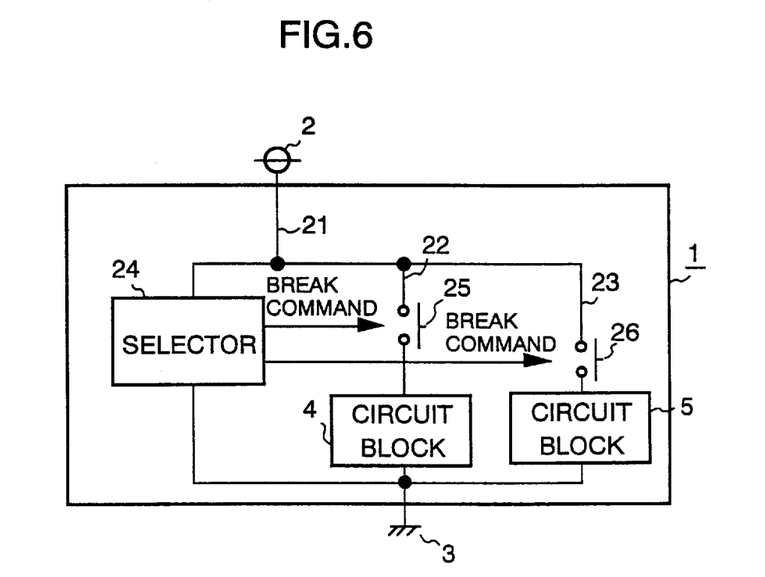
FIG. 6 is a circuit diagram showing an embodiment 3 of the semiconductor integrated device in accordance with the present invention.

FIG. 6 is a circuit diagram showing an embodiment 3 of the semiconductor integrated device in accordance with the present invention, in which the same or corresponding portions to those of FIG. 1 are designated by the same reference numerals, and the description thereof is omitted here.

In this figure, the reference numeral 21 designates a supply interconnection connected to the device power supply 2, 22 designates a supply interconnection connected to the supply interconnection 21 for supplying power to the circuit block 4, 23 designates a supply interconnection connected to the supply interconnection 21 for supplying power to the circuit block 5, 24 designates a selector (control means) for outputting a break command to a switch 25 or 26 as needed, and 25 designates the switch (power supply breaking means) for breaking the supply interconnection 22. The switch 25 has the same structure as the switch 14 as shown in FIG. 1. The reference numeral 26 designates a switch (power supply breaking means) for breaking the supply interconnection 23 in response to the break command issued from the 26. The switch 26 also has the same structure as the switch 14 as shown in FIG. 1.

Next, the operation will be described.

In the embodiment 1, the circuit block 5 cannot operate while the circuit block 4 suspends its operation because it is the circuit block 4 that controls the switch 14 by issuing the break command.

In view of this, in the present embodiment 3, the supply interconnections 22 and 23 have the switches 25 and 26 inserted therein, respectively, and the break command is issued from the selector 24 to the switch 25 or switch 26 independently.

This makes it possible to interrupt the operation of the circuit block 4 or circuit block 5 as needed in accordance with the operation mode of the semiconductor integrated device 1. This also offers an advantage of reducing the consumed power.

Although the semiconductor integrated device 1 includes two circuit blocks in the embodiment 3, it may includes three or more circuit blocks to achieve the same effect as the embodiment 3.

EMBODIMENT 4

Figure 7:
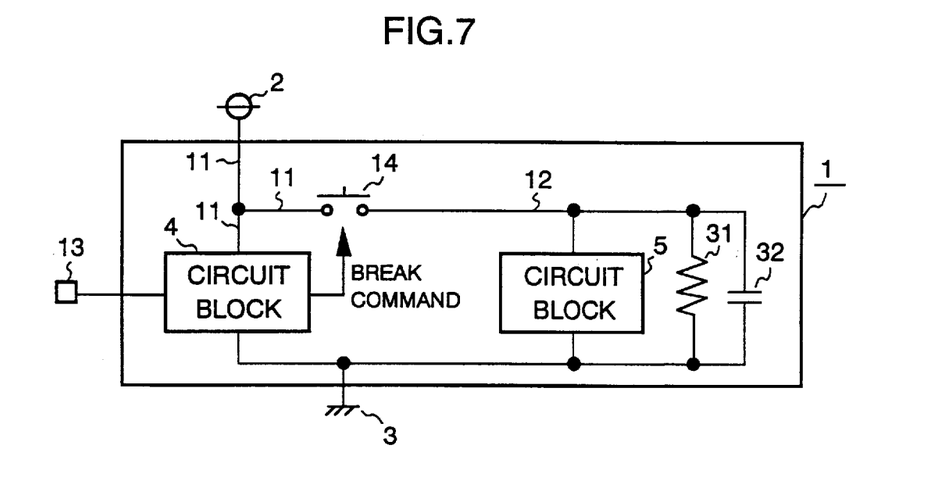
FIG. 7 is a circuit diagram showing an embodiment 4 of the semiconductor integrated device in accordance with the present invention.

FIG. 7 is a circuit diagram showing an embodiment 4 of a semiconductor integrated device in accordance with the present invention, in which the same reference numerals designate the same or corresponding portions to those in FIG. 1, and hence the description thereof is omitted here.

In FIG. 7, the reference numeral 31 designates a resistor connected in parallel with the circuit block 5, and 32 designates a capacitor connected in parallel with the circuit block 5.

Next, the operation will be described.

Since this embodiment is the same as the embodiment 1 except that the resistor 31 and capacitor 32 are provided, the operation of the resistor 31 and capacitor 32 will be described chiefly.

As in the embodiment 1, opening the switch 14 breaks the power supply from the device power supply 2 to the circuit block 5. The resistor 31 and capacitor 32 connected in parallel with the circuit block 5 as shown in FIG. 7 can provide an advantage that the speed can be controlled appropriately of the potential of the second supply interconnection 12 to fall to the ground potential when the switch 14 is opened, by adjusting the time constant of the combination of the resistor 31 and capacitor 32.

EMBODIMENT 5

Figure 8:
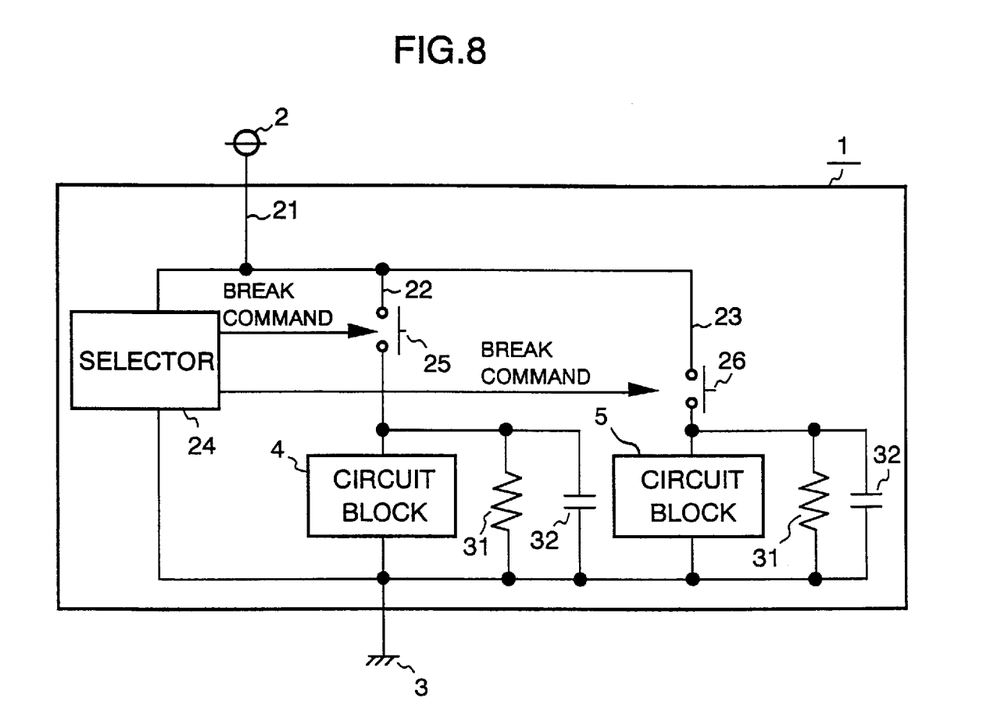
FIG. 8 is a circuit diagram showing an embodiment 5 of the semiconductor integrated device in accordance with the present invention.

Although the circuit block 5 is provided with the resistor 31 and capacitor 32 connected in parallel thereto, the circuit block 4 can also be provided with the resistor 31 and capacitor 32 connected in parallel therewith as shown in FIG. 8 in the case where the supply interconnection 22 connected to the circuit block 4 can be disconnected, offering the same advantage as that of the embodiment 4.

EMBODIMENT 6

Figure 9:
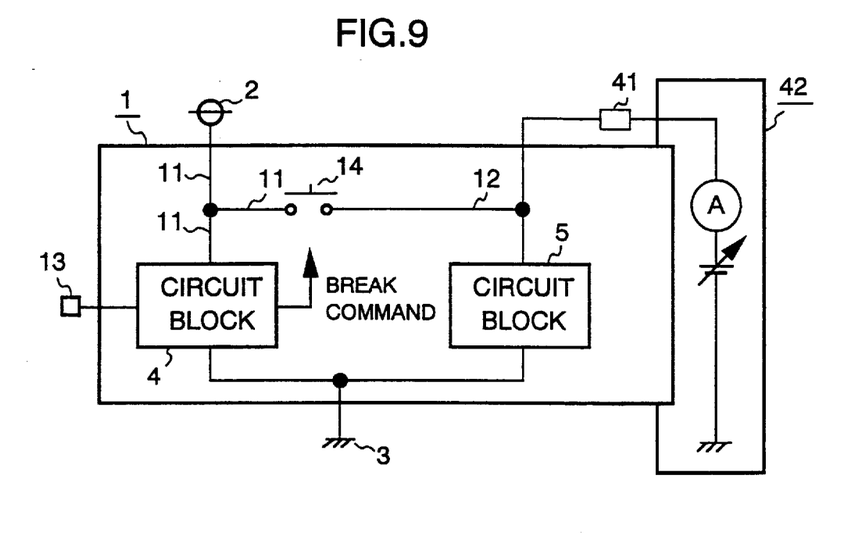
FIG. 9 is a circuit diagram showing an embodiment 6 of the semiconductor integrated device in accordance with the present invention.

FIG. 9 is a circuit diagram showing an embodiment 6 of the semiconductor integrated device in accordance with the present invention, in which the same reference numerals designate the same or corresponding portions to those of FIG. 1, and hence the description thereof is omitted here.

In FIG. 9, the reference numeral 41 designates a pad connected to the second supply interconnection 12, 42 designates an LSI tester for measuring the power supply current of the circuit block 5 when the connecting portion between the first and second supply interconnections 11 and 12 is disconnected by the switch 14.

Next, the operation will be described.

Since the pad 41 connected to the second supply interconnection 12 allows the LSI tester 42 to be connected thereto as shown in FIG. 9, the present embodiment has an advantage that the power supply current of the circuit block 5 can be easily measured using the LSI tester 42 if the power supply to the circuit block 5 is interrupted by the switch 14 when carrying out the operation test of the circuit block 5.

EMBODIMENT 7

Figure 10:
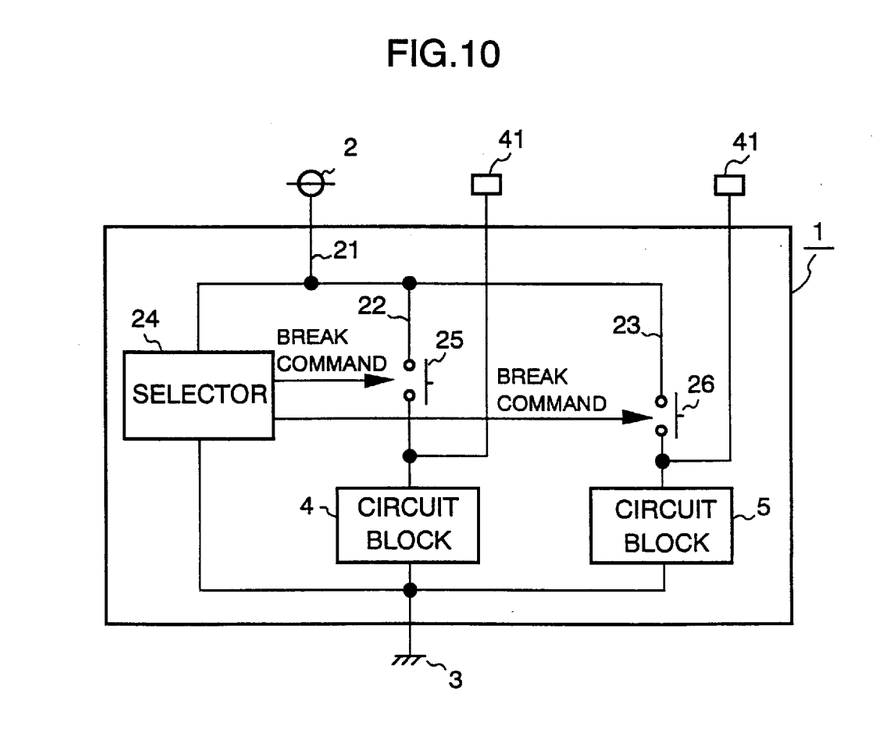
FIG. 10 is a circuit diagram showing an embodiment 7 of the semiconductor integrated device in accordance with the present invention.

Although the pad 41 is connected only to the second supply interconnection 12 in the embodiment 6, it can be connected to the supply interconnection 22 besides the supply interconnection 23 as shown in FIG. 10 when the supply interconnection 22 connected to the circuit block 4 can be disconnected, offering the same advantage as that of the embodiment 6.

What is claimed is:

1. A semiconductor integrated device comprising:
   a first circuit block and a second circuit block operating independently of each other;
   a first supply interconnection connected to a device power supply and to said first circuit block for supplying power to said first circuit block;
   a second supply interconnection connected to said first supply interconnection and to said second circuit block for supplying power to said second circuit block; and
   power breaking means inserted in a connecting portion of said first supply interconnection to said second supply interconnection for breaking said connecting portion in response to a break command,
   wherein said power breaking means has a plurality of switching elements disposed in parallel.

2. The semiconductor integrated device as claimed in claim 1, wherein said power breaking means is formed in a doped region in a substrate in which an end of said first supply interconnection and an end of said second supply interconnection are formed such that the two ends engage in comblike fashion with the two ends electrically isolated from each other, and wherein said power breaking means further comprises an electrode disposed over said two ends for receiving said break command.

3. The semiconductor integrated device as claimed in claim 2, further comprising a resistor and a capacitor which are connected in parallel with said second circuit block.

4. The semiconductor integrated device as claimed in claim 3, further comprising a pad connected to said second supply interconnection.

5. The semiconductor integrated device as claimed in claim 2, further comprising a pad connected to said second supply interconnection.

6. The semiconductor integrated device as claimed in claim 1, further comprising a resistor and a capacitor which are connected in parallel with said second circuit block.

7. The semiconductor integrated device as claimed in claim 6, further comprising a pad connected to said second supply interconnection.

8. The semiconductor integrated device as claimed in claim 1, further comprising a pad connected to said second supply interconnection.

9. A semiconductor integrated device comprising:
   a plurality of circuit blocks operating independently of each other;

a first supply interconnection connected to a device power supply;

a plurality of second supply interconnections, each of which is connected directly to said first supply interconnection and to one of said plurality of circuit blocks for supplying power to said one of said plurality of circuit blocks;

control means for outputting a break command; and a plurality of power breaking means for breaking said plurality of supply interconnections in response to said break command issued from said control means, each of said plurality of power breaking means being inserted in one of said plurality of second supply interconnections to interrupt it, wherein each of said power breaking means has a plurality of switching elements disposed in parallel.

10. The semiconductor integrated device as claimed in claim 9, wherein said plurality of power breaking means are formed in a doped region in a substrate in which an end of a primary side and an end of a secondary side of each of said plurality of supply interconnections are formed such that the two ends engage with each other in comblike fashion with the two ends electrically isolated from each other, and wherein each of said plurality of power breaking means further comprises an electrode disposed over said two ends for receiving said break command.

11. The semiconductor integrated device as claimed in claim 10, further comprising a resistor and a capacitor which are connected in parallel with each of said circuit blocks.

12. The semiconductor integrated device as claimed in claim 11, further comprising a pad connected to each one of said plurality of supply interconnections.

13. The semiconductor integrated device as claimed in claim 10, further comprising a pad connected to each one of said plurality of supply interconnections.

14. The semiconductor integrated device as claimed in claim 9, further comprising a resistor and a capacitor which are connected in parallel with each of said circuit blocks.

15. The semiconductor integrated device as claimed in claim 14, further comprising a pad connected to each one of said plurality of supply interconnections.

16. The semiconductor integrated device as claimed in claim 9, further comprising a pad connected to each one of said plurality of supply interconnections.

* * * * *